(12) United States Patent
Ben-Michael et al.

(10) Patent No.: US 7,964,435 B2
(45) Date of Patent: Jun. 21, 2011

(54) METHOD FOR DOPANT DIFFUSION

(75) Inventors: Rafael Ben-Michael, Scotch Plains, NJ (US); Mark Allen Itzler, Princeton, NJ (US); Xudong Jiang, Princeton, NJ (US)

(73) Assignee: Princeton Lightwave, Inc., Cranbury, NJ (US)

( * ) Notice: Subject to any disclaimer, the term of this patent is extended or adjusted under 35 U.S.C. 154(b) by 867 days.

(21) Appl. No.: 11/682,999

(22) Filed: Mar. 7, 2007

(65) Prior Publication Data

US 2008/0220598 A1 Sep. 11, 2008

(51) Int. Cl.
*H01L 21/00* (2006.01)
(52) U.S. Cl. .................................. 438/91; 257/E21.357
(58) Field of Classification Search .......... 438/510–569, 438/91, 380; 257/E21.355, E21.357
See application file for complete search history.

(56) References Cited

U.S. PATENT DOCUMENTS

| 6,015,721 A | 1/2000 | Kim |
| 2006/0081874 A1* | 4/2006 | Francis et al. ................. 257/186 |
| 2006/0121683 A1* | 6/2006 | Francis et al. ................. 438/380 |

FOREIGN PATENT DOCUMENTS

EP 1679749 A1 * 7/2006

OTHER PUBLICATIONS

Liu et al.; Simple, very low dark current, planar long-wavelength avalanche photodiode; Oct. 3, 1988; Apply. Phys. Lett. 53 (14).*
Chaudhari, Chandra P., "U.S. Appl. No. 12/243,488 Restriction Requirement May 3, 2010", , Publisher; USPTO, Published in: US.
Menz, Douglas M., "U.S. Appl. No. 12/243,488 Office Action Sep. 20, 2010", , Publisher: USPTO, Published in: US.

\* cited by examiner

*Primary Examiner* — Chandra Chaudhari
(74) *Attorney, Agent, or Firm* — DeMont & Breyer, LLC

(57) ABSTRACT

A method for controlling dopant diffusion is disclosed. Using certain control parameters that are not used in the prior art, the method provides an unprecedented measure of control over the dopant diffusion process. The control parameters include, among others, the size of the diffusion windows in the diffusion mask and the proximity of the diffusion windows to a dopant sink. In some embodiments, the diffusion process is conducted in an epi-reactor.

18 Claims, 9 Drawing Sheets

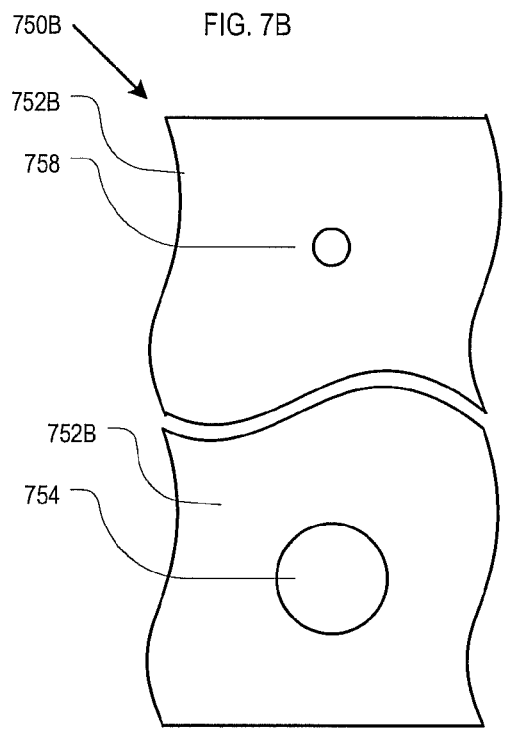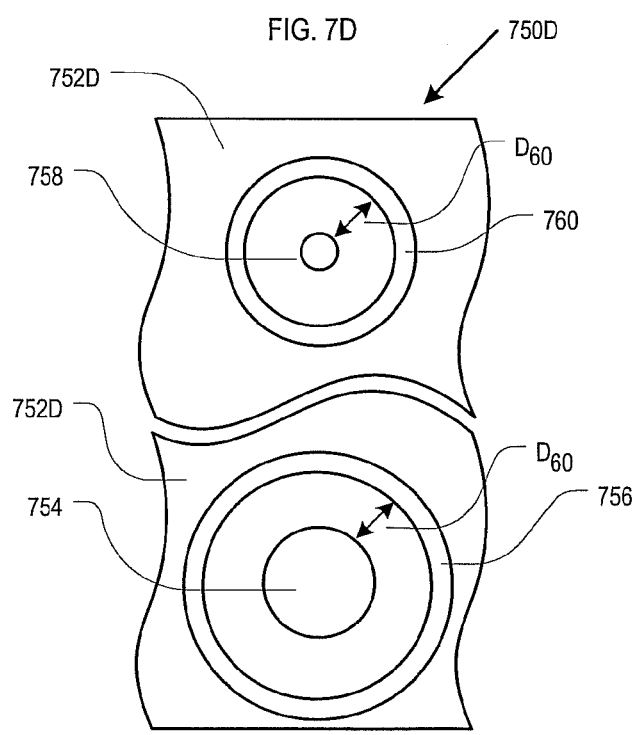

METHOD FOR DOPANT DIFFUSION

FIELD OF THE INVENTION

The present invention relates to ways to control the diffusion of dopants.

BACKGROUND OF THE INVENTION

Dopant diffusion is a standard process that is used when fabricating some semiconductor-based devices. One important application for this process is to create buried p-n junctions, such as are formed during the manufacture of optoelectronic photodetectors.

To create buried p-n junctions via dopant diffusion, a diffusion mask is first patterned onto a wafer (e.g., indium phosphide wafer, etc.). Typically, the wafer is characterized by a background dopant concentration of either n-type (i.e., resulting in an n-type wafer) or p-type (i.e., resulting in a p-type wafer). The mask includes "windows" that are open to the underlying semiconductor at specific regions. The specific arrangement of the windows in the mask is based on the layout and geometry of the devices being formed.

Dopant atoms of the opposite type in the wafer (i.e., n or p) are delivered to the diffusion mask. The dopant atoms diffuse through the windows and then into the semiconductor to form p-n junctions. The diffusion process is controlled via parameters such as temperature and dopant partial pressure. Typically, elevated temperature (about 500° C.) is required to achieve reasonable diffusion times.

To form reliable, high performance, uniform buried p-n junctions requires a well-controlled diffusion process. To achieve this control, the following process capabilities are typically required:

The source of dopant material must be well controlled (e.g., good control over dopant partial pressure, etc.).

The process must be isolated from contaminants that can disrupt the diffusion process or adversely affect material quality.

Several approaches are known for implementing the dopant diffusion process. Perhaps the simplest approach is "sealed ampoule diffusion," wherein a wafer (e.g., indium phosphide wafer, etc.) is sealed in a clean vessel along with a source of dopant atoms. The entire vessel is heated to a required diffusion temperature to cause the dopant atoms to diffuse into the wafer.

More recently, dopant diffusion processes have been conducted in reactors that were initially designed for epitaxial growth. These so-called "epi-reactors" have proven to be an excellent environment for dopant diffusion. The reason for this is that the primary process requirements for epitaxial growth of semiconductors—namely, precise control of source material, highly-accurate temperature control, and a contamination-free process environment—are identical to those for dopant diffusion. Furthermore, the epi-reactor process provides a much finer degree of control over a variety of important process parameters (e.g., dopant precursor concentration, ambient environment during diffusion, ambient overpressure, etc.) than alternative processes.

The use of the epi-reactor for dopant diffusion has focused mainly on metal-organic chemical vapor deposition (MOCVD) for MOCVD diffusion. Researchers have used this platform for p-type doping of InP (and related materials such as InGaAs and InAsP) with zinc (Zn) using an appropriate precursor dopant source such as diethylzinc (DEZn) or dimethylzinc (DMZn).

To date, the primary focus of experimentation with dopant diffusion has been to achieve process control and reproducibility. Studies have considered the influence on the diffusion process of parameters such as: temperature; dopant partial pressure; diffusion time; the effect of annealing operations; the effect of different carrier gases; and the influence of dislocation density, among others.

To be sure, these parameters provide a measure of control over the process, but they do nothing to address certain limitations of the dopant diffusion process, as currently practiced. For example, thus far, dopant diffusion in an epi-reactor has been limited to providing a single diffusion depth for all devices that are processed during a single execution of the process.

It would be very desirable to be able vary, within a single execution of the process and from device-to-device, diffusion depth. But doing so will require the use of control parameters that are different from those that have been studied and utilized in the prior art.

SUMMARY OF THE INVENTION

The illustrative embodiment of the present invention is a method for controlling dopant diffusion (e.g., in a semiconductor, etc.). By using certain control parameters that are not used in the prior art, the method provides an unprecedented measure of control over the dopant diffusion process. In the embodiments described herein, the diffusion process is conducted in an epi-reactor. It is to be understood, however, that methods disclosed herein can be implemented in conjunction with other diffusion technologies, such as, without limitation, sealed ampoule or open tube techniques In accordance with the illustrative embodiment of the invention, dopant diffusion is controlled in several ways, as follows:

(i) A dopant "sink" is situated near to the intended diffusion sites (i.e., near to the windows in the diffusion mask). In the illustrative embodiment, the dopant sink is an opening through the diffusion mask that is typically distinct from the diffusion window itself or distinct from any test areas that are often provided to performing device testing, etc. In some embodiments, the dopant sink is an annular opening or "moat" that surrounds the diffusion window. The presence and proximity of the dopant sink to a diffusion window is a first control variable that affects diffusion depth. In some embodiments, the open area of the dopant sink is another control variable that affects diffusion depth.

(ii) The size of the diffusion window itself affects diffusion depth, and, therefore, can also be used as a control variable. In situations in which there is an ability to vary the size of the diffusion window, diffusion depth can be varied from device to device during a single execution of the process. Furthermore, the size of the diffusion window can be used in conjunction with other process variables, such as dopant concentration and ambient temperature, to provide a specific diffusion depth.

(iii) In addition, the control variables mentioned above in (i) and (ii) can be used in conjunction with one another to provide an extreme measure of control over the diffusion process (e.g., achieving very precise target doping depths, etc.).

In various embodiments, these control methodologies provide a way, for example, to: (a) vary diffusion depth from device-to-device during a single execution of a diffusion process; (b) provide a uniform diffusion depth during a single execution of a diffusion process when device geometry dictates different-size diffusion windows in the mask (which would otherwise result in different diffusion depths during a single execution of the diffusion process); and (c) to precisely control dopant diffusion depth.

The methods disclosed herein are based on a discovery by the inventors. The discovery was the result of experimentation, some of which is discussed below and depicted in the accompanying figures. Although an explanation for the observed results is offered, it will be understood that the semiconductor doping process involves complex molecular and atomic kinetics that are far beyond the scope of this document. The explanation offered is, therefore, simply intended as an aid to understanding the invention, and not as a definitive explanation of its underpinnings.

A first set and a second set of experiments were conducted in which zinc ("Zn") was diffused into an epitaxially-grown layer of indium phosphide ("InP") on InP wafers. The use of Zn as a dopant is desirable since it diffuses relatively quickly, can achieve high doping concentrations to yield low resistance contacts, and provides sharp diffusion profiles that yield p-n junctions with sharp interfaces. Typical diffusion temperatures are about 500° C. The precursor for the Zn atoms was diethylzinc ("DEZn"). The resulting Zn profile was accurately measured using secondary ion mass spectroscopy (SIMS).

For each set of experiments, three different wafers "W1," "W2," and "W3" were used. For the first set of experiments, wafer W1 was completely unmasked (i.e., there was no diffusion mask). Wafer W2 had about ninety-nine percent of its surface covered with a diffusion mask, which was a dielectric thin film comprising silicon nitride. Within the mask of wafer W2 were diffusion windows having a diameter of about 230 microns (μm). Wafer W3 also had about ninety-nine percent of its surface covered with the same silicon nitride-based diffusion mask. The diffusion windows in the mask on wafer W3 had a diameter of about 70 microns.

For the second set of experiments, wafer W1 was completely unmasked, like the first set of experiments. But wafers W2 and W3 were configured somewhat differently than for the first set of experiments. In particular, although wafers W2 and W3 had the same respective 230 micron- and 70 micron-diameter openings in their diffusion masks, they also included a grid of 50 micron-wide "streets." These streets, which were etched into the diffusion mask of wafers W2 and W3 every 400 microns in two orthogonal directions to form a square grid, separated adjacent diffusion windows. The presence of the streets reduced the mask coverage of wafers W2 and W3 to about 76 percent.

FIG. 1 depicts Zn diffusion profiles obtained from the first set of experiments. Profile 100 is for wafer W1, profile 102 is for wafer W2, and profile 104 is for wafer W3. For these experiments, the diffusion was conducted for twenty-two minutes.

The shallowest diffusion is achieved for completely unmasked wafer W1, as indicated via profile 100 in FIG. 1. Arbitrarily defining the p-n junction position as the depth at which a doping level of $2 \times 10^{16}$ cm$^{-3}$ is achieved, the junction depth for wafer W1 was about 1.55 μm.

Deeper diffusions are obtained for wafers W2 and W3. As seen from profile 102, the junction depth (as defined above) for the wafer having the larger diffusion window (i.e., wafer W2) was 1.74 μm. The junction depth for the wafer having the smaller diffusion window (i.e., wafer W3) was 1.97 μm.

FIG. 2 depicts Zn diffusion profiles obtained from the second set of experiments. Profile 200 is for wafer W1, profile 202 is for wafer W2, and profile 204 is for wafer W3. For these experiments, the diffusion was conducted for twelve minutes.

The diffusion profiles for all three wafers W1, W2, and W3 were the same to within the measurement error (i.e., about 0.01 μm) of the SIMS technique.

The results from these experiments have been interpreted as follows. Dopant atoms on the surface of the diffusion mask are mobile and randomly migrate on the surface via surface diffusion. When a dopant atom arrives at an unmasked portion of the semiconductor surface, there is a finite probability that it will diffuse into the bulk of the semiconductor material. If a relatively greater fraction of the semiconductor surface is masked, a relatively greater amount of dopant is available for doping those portions of the surface that are unmasked. Conversely, if a relatively greater fraction of the semiconductor surface is not masked, a relatively lesser amount of dopant is available for doping those unmasked portions. At the limit, if none of the semiconductor surface is masked, dopant penetrates the entire surface uniformly. This situation defines the minimum diffusion depth possible for a given set of process parameters (i.e., temperature, dopant flow rate, ambient pressure, etc.).

From the foregoing interpretation, the underlying principles of the invention were developed. In particular, when most of the surface of a wafer is masked, substantial variations in diffusion depth can be introduced for different-sized devices (i.e., different-sized diffusion windows). Furthermore, for devices of identical sizes, different diffusion depths can be achieved by appropriately tailoring the amount of masked surface area (e.g., via a diffusion sink, etc.) in the vicinity of the area to be diffused. These principles, and permutations thereof, provide new ways to control a dopant diffusion process.

One embodiment of the invention is a method for diffusing dopant into a semiconductor, wherein the method comprises:
  determining a first desired diffusion depth to which the dopant is to be diffused, at a first location, into the semiconductor;
  forming a diffusion mask over the semiconductor;
  forming a first physical feature in the diffusion mask, wherein the first physical feature is characterized by a first attribute, and wherein the first attribute is a function of the first desired diffusion depth; and
  diffusing the dopant into the semiconductor at the first location to the first desired diffusion depth.

Another embodiment of the invention is a diffusion mask that is used in conjunction with the method, comprising:
  a layer of material that is resistant to diffusion by a dopant;
  a diffusion window in the layer; and
  a diffusion sink in the layer, wherein a distance between the diffusion sink and the diffusion window is based on a depth to which the dopant is to be diffused into the underlying material.

BRIEF DESCRIPTION OF THE DRAWINGS

FIG. 7B depicts a portion of a wafer, including a diffusion mask and diffusion windows.

FIG. 7D depicts a portion of a wafer, including a diffusion mask, diffusion windows, and annular dopant sinks.

DETAILED DESCRIPTION

The illustrative embodiment of the present invention is a method for dopant diffusion. This method can be used, for example, to form p-n junctions. Such junctions are present in photodiodes, such as avalanche photodiodes, among other opto-electronic devices. To provide context for the description of the illustrative embodiment of the present invention, some background information concerning avalanche photodiodes is provided below. The methods described herein can be used to form avalanche photodiodes as well as other types of opto-electronic or micro-electronic devices.

Figure 1:
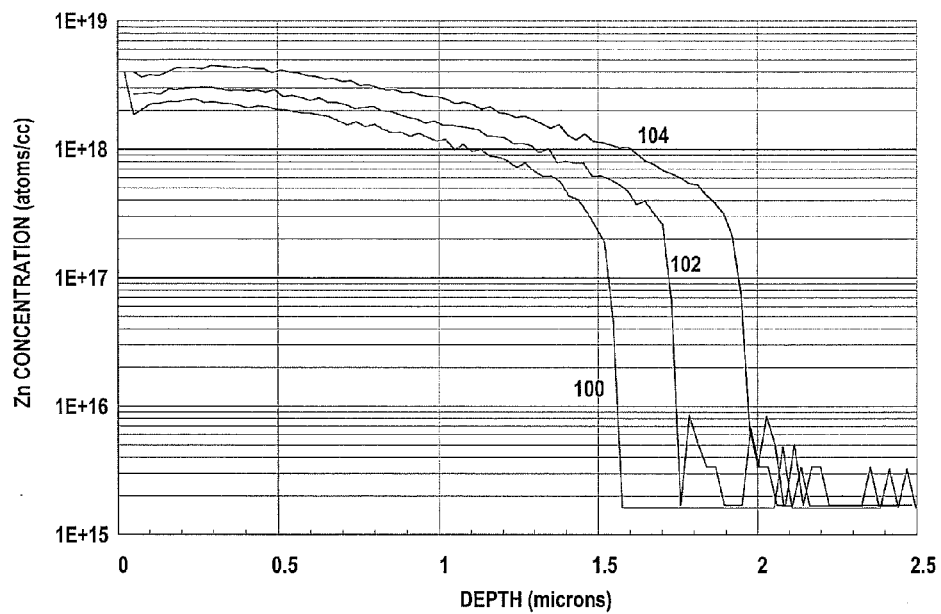
FIG. 1 depicts diffusion profiles for Zn dopant, as obtained for a first set of dopant diffusion experiments.
Figure 2:
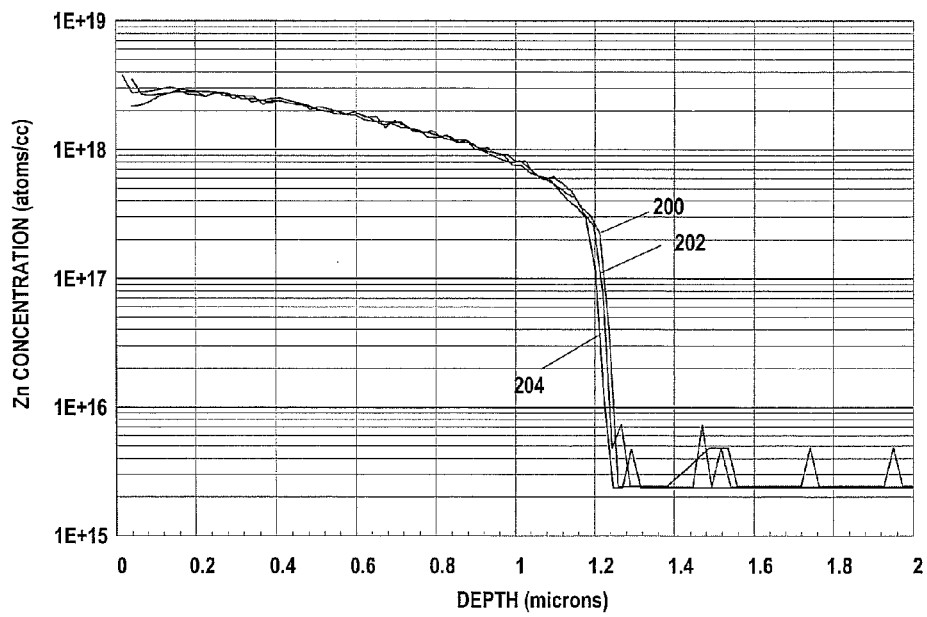
FIG. 2 depicts diffusion profiles for Zn dopant, as obtained for a second set of dopant diffusion experiments.
Figure 3:
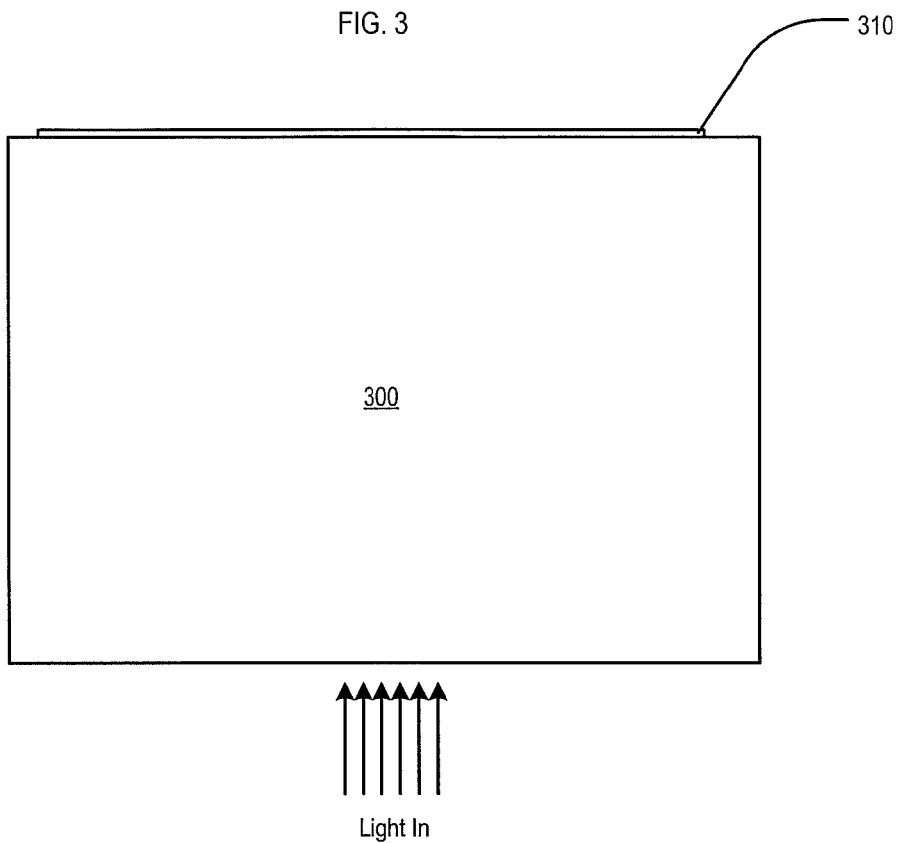
FIG. 3 depicts a conventional avalanche photodiode disposed on an InP wafer.
Figure 4:
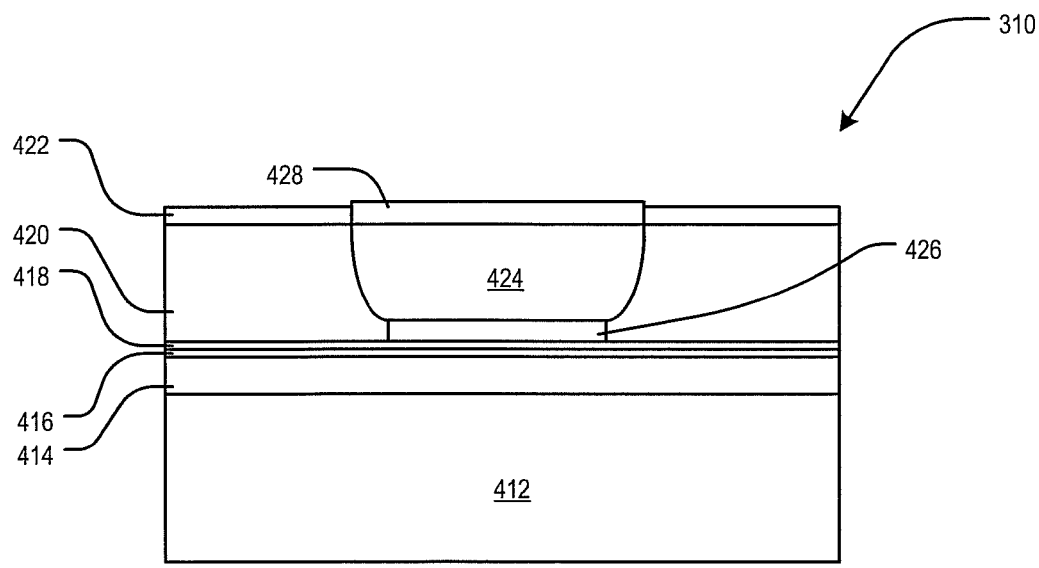
FIG. 4 depicts the structure of the avalanche photodiode of FIG. 3.

FIGS. 3 and 4 depict a conventional avalanche photodiode. This type of diode is particularly well suited for low-light applications, because its internal gain can provide high signal-to-noise ratio in optical receivers. It also yields the potential for very high frequency operation (i.e., gigaHertz). FIG. 3 depicts avalanche photodiode 310 formed on wafer 300 (e.g., InP wafer, etc.). FIG. 4 depicts various layers of avalanche photodiode 310.

Avalanche photodiode 310 is formed by depositing successive layers of material on a wafer in known fashion. Beginning from the surface of wafer 300, photodiode 310 comprises layer 412 of n-type indium phosphide (InP), absorption layer 414 of indium gallium arsenide (InGaAs), grading layer 416, field control layer 418, another layer 420 of InP, and passivation layer 422. Diffusion region 424 results from dopant diffusion, wherein atoms of an appropriate dopant, such as zinc, are diffused into the semiconductor. The region between the bottom of diffusion region 424 and the top of field control region 418 defines multiplication region 426. Layer 428 of metal is disposed over diffusion region 424. Those skilled in the art will be familiar with the structure of photodiode 310, as described above, and how to make and use it.

An important operating parameter of certain photodiodes, such as avalanche photodiodes, is "breakdown voltage." With high reverse voltage applied to a p-n diode, the associated high electric field strength causes free carriers (i.e., electrons and holes) to become accelerated to a velocity at which impact ionization can occur, thereby creating new free carriers. The free electrons and holes that are created are likewise accelerated and create new electron-hole pairs, and so forth. The net result is that the avalanche photodiode exhibits internal "multiplication gain", thereby providing a larger output photocurrent than a photodiode without internal gain. At sufficiently high applied voltage, a breakdown occurs in which the gain diverges, with the associated reverse current increasing extremely rapidly with small incremental increases in reverse bias voltage.

The avalanche photodiode is operated at near-breakdown voltage. As previously stated, the breakdown voltage is, therefore, an important design parameter for these and other types of photodiodes. But the primary design consideration for a photodiode will typically be an operational characteristic, such as multiplication gain, operating speed, noise level, dark current, etc. This characteristic is a function of the application for the photodiode. Knowing the particular application and having decided upon an operational characteristic, those skilled in the art will be able to calculate what the breakdown voltage ought to be to produce a photodiode that exhibits the desired characteristic.

For a given photodiode structure (e.g., materials, layer thicknesses, layer dopings, etc.), the chief determinant of breakdown voltage is dopant diffusion depth (i.e., the depth of diffusion region 424 in FIG. 4). There is, in fact, a well-understood relationship between breakdown voltage and dopant depth; one can be calculated knowing the other (and other specifics of the opto-electronic device). Over a wide range of diffusion depth, the deeper that dopant diffuses into the semiconductor material, the lower the breakdown voltage. It is this parameter—the depth to which dopant is diffused into the semiconductor—that is actually controlled to form a photodiode having the desired breakdown voltage and, hence, the desired operating characteristic.

Figure 5:
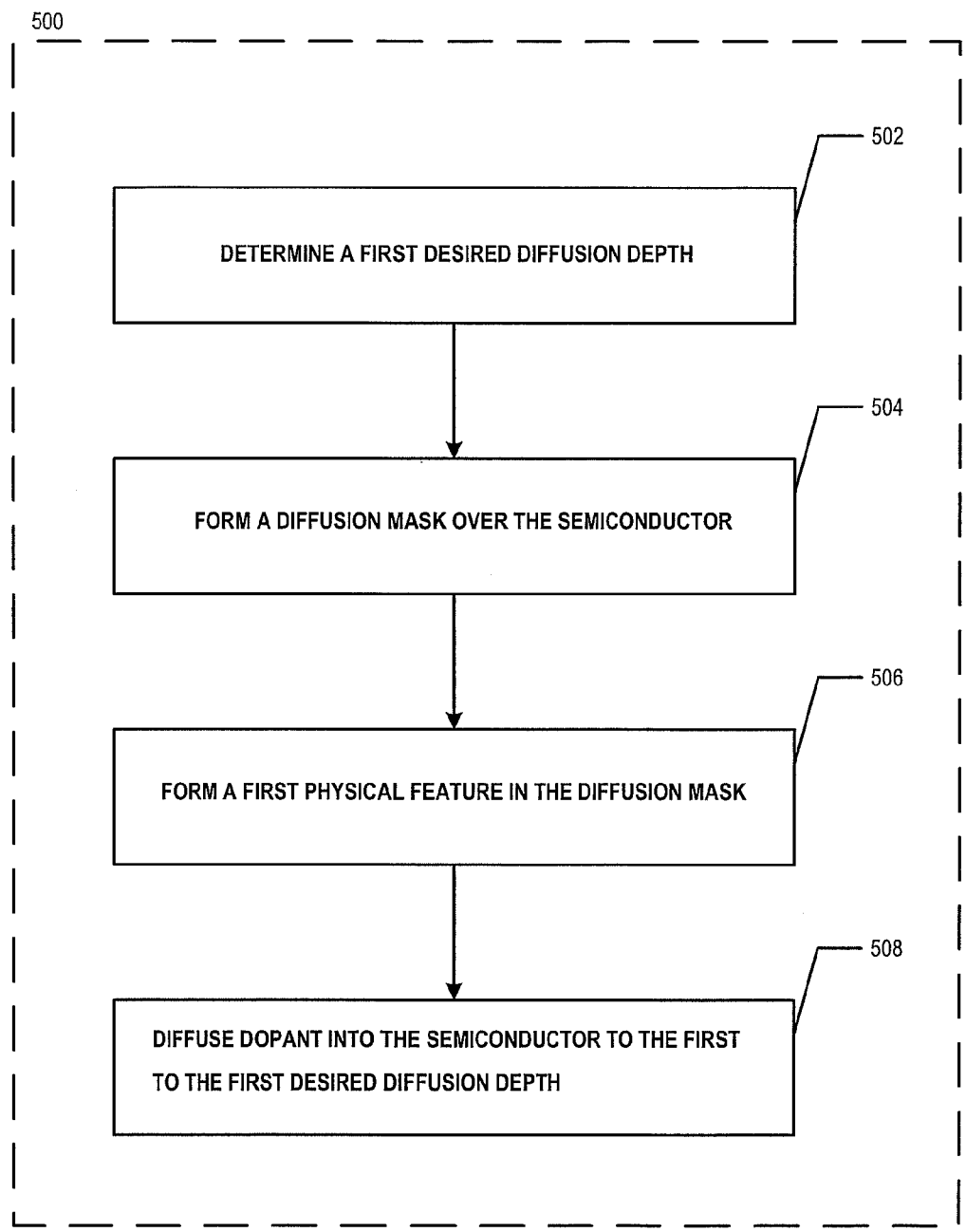
FIG. 5 depicts method 500 for diffusing dopant into semiconductor, in accordance with the illustrative embodiment of the present invention

Turning now to FIG. 5, method 500 for dopant diffusion in accordance with the illustrative embodiment of the present invention is depicted. Method 500 recites the operations of:

502: Determining a first desired diffusion depth.
504: Forming a diffusion mask.
506: Forming a first physical feature in the diffusion mask.
508: Diffusing the dopant to the desired diffusion depth.

Operations 502, 504, and 508 are conventional diffusion operations that are performed using known techniques. Particularly germane to an understanding of the present invention are the details of operation 506.

Figure 6:
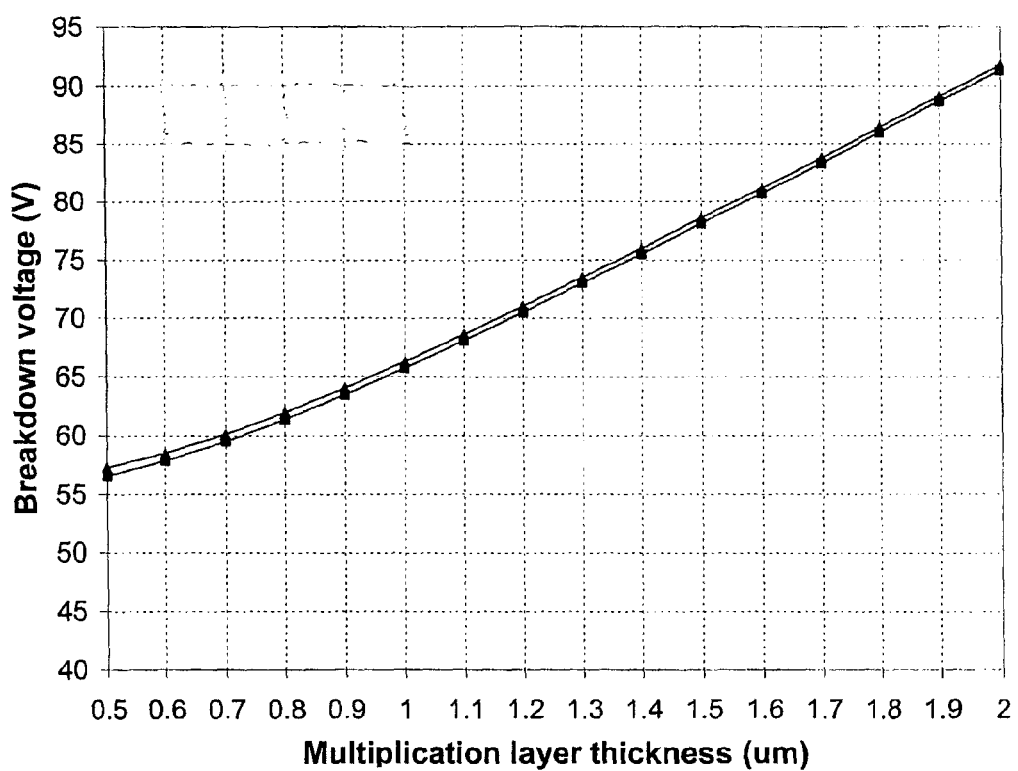
FIG. 6 depicts a plot of breakdown voltage as a function of the thickness of the multiplication layer of a conventional avalanche photodiode, such as depicted in FIG. 4.

Referring now to operation 502 of method 500, a first desired dopant diffusion depth is determined. This can be done as follows. As previously indicated, there is a direct, calculable relationship between breakdown voltage and the depth to which dopant is diffused (i.e., into a semiconductor layer, such as InP layer 420 in photodiode 310 of FIG. 4). The relationship, which is typically expressed as breakdown voltage vs. multiplication layer thickness, is defined by certain expressions that are well known to those skilled in the art. FIG. 6 depicts a plot showing the calculated relationship between breakdown voltage and multiplication layer thickness for two different avalanche photodiodes. While variations in the particular structure of a given photodiode (e.g., materials, layer thicknesses, layer dopings, etc.) will have some effect on this predicted relationship, it doesn't vary significantly.

With reference to FIG. 4, diffusion depth is equal to the thickness of layer 520 minus the thickness of multiplication layer 426. The thickness of layer 520 is a design criterion (it will be known) and the multiplication layer thickness can be calculated for a desired breakdown voltage, as discussed above. The desired diffusion depth is therefore obtained by difference.

As a consequence, given a desired operating characteristic, those skilled in the art can calculate the required dopant diffusion depth.

Photodiodes (or other opto-electronic or micro-electronic devices) will be formed in certain locations on a wafer. As previously discussed, to create a p-n junction, dopant, such as zinc, must be diffused into the nascent opto-electronic devices. To prevent dopant from diffusing into underlying layers at any location other than a desired location (i.e., where the opto-electronic devices are located), a diffusion mask is formed over the various device layers, in accordance with operation 504 of method 500. The diffusion mask is typically a dielectric thin film (e.g., silicon nitride, etc.) that resists diffusion by the selected dopant. The diffusion mask is usually formed by low-pressure chemical vapor deposition (LPCVD), plasma-enhanced chemical vapor deposition (PECVD), sputter deposition, evaporative deposition, or liquid spin-on techniques.

To define the geometry of the diffused region in a photodiode, etc., the diffusion mask includes a plurality of openings or windows. These windows permit access to the underlying device layers. The windows are formed in known fashion using standard photolithographic techniques. Those skilled in the art will be able to deposit material to form a diffusion mask and create windows in the mask at appropriate locations.

In accordance with operation 506, a first physical feature is formed in the diffusion mask. The first physical feature is characterized by a "first attribute," wherein the first attribute is a function of the desired diffusion depth. As a consequence, the first physical feature, as characterized by the first attribute, serves as a control variable for the illustrative dopant diffusion process.

In some embodiments, the first physical feature is one or more of the previously mentioned diffusion windows. In such embodiments, the diffusion window serves to control dopant diffusion depth, as well as performing its normal function of providing access through the diffusion mask. The "first attribute" of the diffusion window, which is a function of the desired diffusion depth, is the size (e.g., diameter, open area, etc.) of the diffusion window. Of course, conventional diffusion masks necessarily include diffusion windows. But in conventional masks, the size of the diffusion window is not selected to achieve a desired diffusion depth, as it is in accordance with the illustrative method.

In some other embodiments, the first physical feature is a dopant sink. The dopant sink, which has not hitherto been used in diffusion masks, is an opening through the diffusion mask that is distinct from the diffusion window itself and distinct from any test openings that are often provided for performing on-wafer device testing, etc.

In some embodiments, the dopant sink is an annular opening or "moat" that surrounds the diffusion window. In some other embodiments, the dopant sink does not surround the diffusion window(s). Typically, the dopant sink is situated within about 1500 microns of the intended diffusion sites (i.e., near to the windows in the diffusion mask). That distance, however, can vary as a function of the total open area of the dopant sink. That is, directionally, the larger the open area of the diffusion sink, the further it can be from the diffusion windows and still have an effect on dopant diffusion depth. As described further below, the specific effect of distance and size is best determined by experimentation.

In some embodiments in which the first physical feature is a dopant sink, the first attribute is the distance between the dopant sink and a diffusion window. In some other embodiments, the first attribute of the dopant sink is its size (e.g., diameter, open area, etc.).

Furthermore, in some embodiments, both the diffusion window(s) and dopant sink(s) are used together to control dopant depth.

In operation 508, dopant is diffused into the appropriate device layer to the depth specified in operation 502; that is, dopant is diffused to the first desired diffusion depth. Those skilled in the art will know how to perform this operation in an epi reactor or other diffusion platform.

Using the size of the diffusion window and the presence of a diffusion sink as a dopant depth control variable, in accordance with method 500, provides an improved ability to control the diffusion process relative to the prior art. In particular, using the methods disclosed herein, dopant can be diffused to multiple desired diffusion depths in a single execution of the method. Or, dopant diffusion depth can be controlled to a uniform depth, even when the geometry of the devices that are being formed dictate a significant variation in the size of the diffusion window.

The "physical feature" and its effect on dopant diffusion depth is a critical aspect of the methods disclosed herein. As a consequence, further disclosure concerning this subject is provided below in conjunction with FIGS. 7A through 7D and 8-11. All experimental data discussed below is for the use of zinc dopant, sourced from DEZn, wherein the process is conducted in an epi-reactor. To the extent that the diffusion process is varied, there might be a quantitative differences in the physical feature/diffusion depth relationship, but qualitatively, it will remain the same.

Figure 7A:
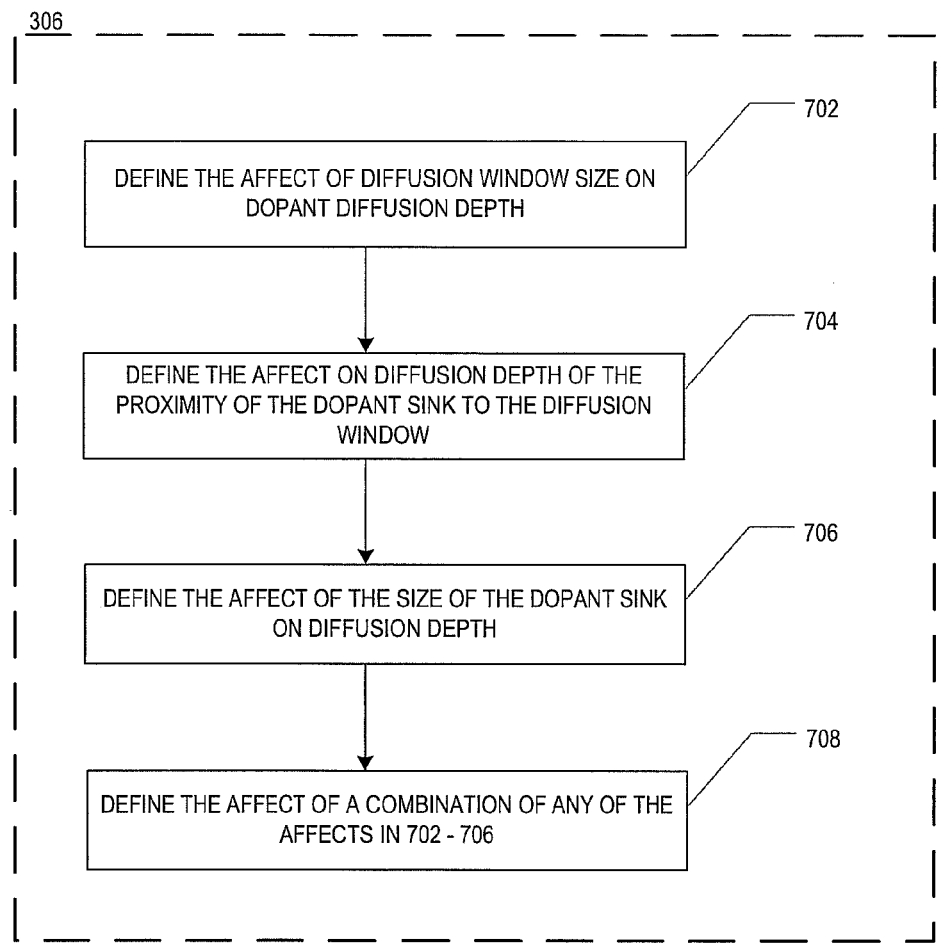
FIG. 7A depicts various sub-operations for practicing method 500 of FIG. 5.

FIG. 7A depicts several sub-operations that can be used preparatory to performing operation 506. Those sub-operations include:

702: Defining the effect of diffusion window size on dopant diffusion depth.
704: Defining the effect on diffusion depth of the proximity of the dopant sink to the diffusion window.
706: Defining the effect of the size of the dopant sink on diffusion depth.
708: Defining the effect of any combination of operations 702 through 706.

Not all of the sub-operations that are shown in FIG. 7A are required to perform operation 506. For example, in some embodiments, only one operation (e.g., sub-operation 704, etc.) will be performed in support of operation 506. In some other embodiments, more than one sub-operation will be performed. It is notable that, to the extent that more than one sub-operation is used, the order in which the sub-operations are performed is arbitrary.

Sub-operation 702. The relationship between diffusion window size and dopant diffusion depth is now examined with reference to FIGS. 7B and 8. This relationship is defined (quantified) by experimentation and applies to a specific set of conditions (e.g., dopant partial pressure, temperature, time, etc.) in the dopant diffusion reactor.

FIG. 7B depicts a portion of wafer 750. The wafer is covered by diffusion mask 752B, which includes diffusion windows 754 and 758. Only two diffusion windows are shown in FIG. 7B for reasons of clarity; typically, there will be many more diffusion windows in a diffusion mask to provide access to the many opto-electronic devices that are disposed underneath the mask.

For the mask that is depicted in FIG. 7B, the two diffusion windows have different sizes; diffusion window 754 has a diameter of 125 microns and diffusion window 758 has a diameter of 40 microns.

Figure 8:
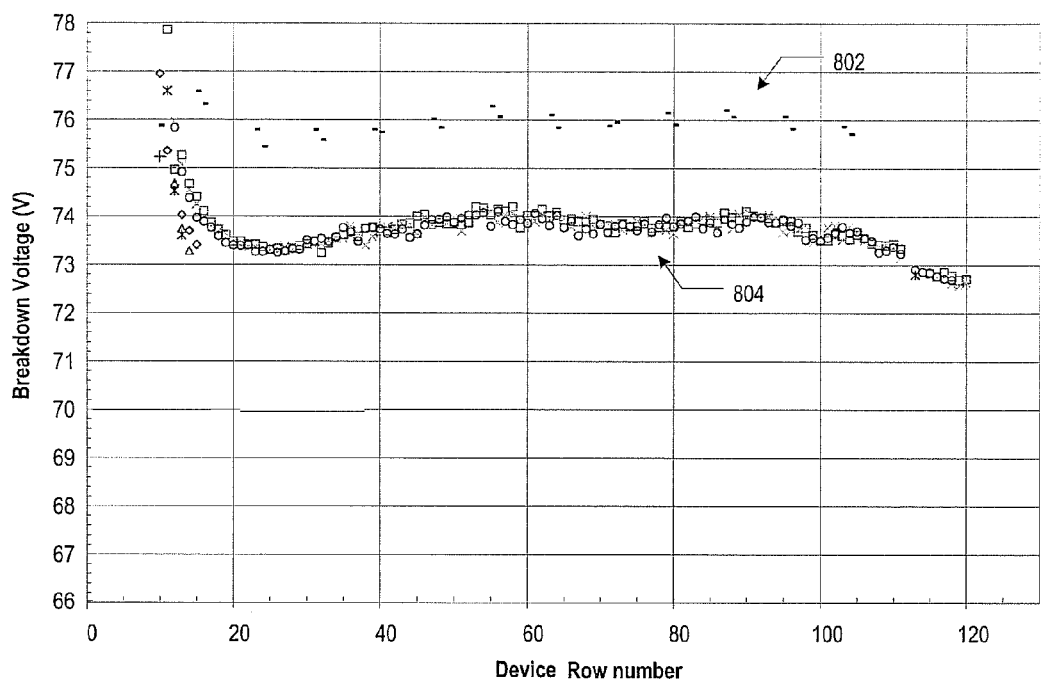
FIG. 8 depicts a plot of breakdown voltage for two different-size diffusion windows, as per FIG. 7B, wherein the plot illustrates a relationship between dopant diffusion depth and diffusion window size.

The plots in FIG. 8 show breakdown voltage for photodiodes that are disposed beneath diffusions windows 754 and 758. Recall that there is a causal relationship between breakdown voltage and multiplication region depth and, hence, dopant diffusion depth (see, FIG. 6 and the accompanying description). Breakdown voltage is measured rather than dopant diffusion depth because the former can be measured with far greater accuracy than the latter.

The breakdown voltage for an avalanche photodiode beneath diffusion window 754 is depicted in plot 802 and the breakdown voltage for an avalanche photodiode beneath diffusion window 758 is depicted in plot 804. FIG. 8 provides data for many devices. For the experiment, a plurality of avalanche photodiodes were formed on a wafer, and a diffusion mask having a plurality of diffusion windows corresponding to either diffusion window 754 or 758 were formed over each device.

As depicted in FIG. 8, avalanche photodiodes that were located under the smaller diffusion window—window 758 (plot 804)—had lower breakdown voltage than those that were located under the larger diffusion window—window 754 (plot 802). As previously disclosed, a relatively lower breakdown voltage is indicative of a relatively deeper dopant diffusion depth. In fact, the difference in breakdown voltage is about 2 volts, which equates to a difference in dopant diffusion depth of about 0.07 to about 0.08 microns (see, e.g., FIG. 6). Thus, the difference in the sizes of the diffusion windows resulted in a difference in dopant diffusion depth of about 0.07 to 0.08 microns.

Sub-operation 704. The relationship between the dopant diffusion depth and the proximity of the diffusion window size to a dopant sink is now examined with reference to FIGS. 7C and 9. This relationship is defined (quantified) by experimentation and applies to a specific set of conditions (e.g., dopant partial pressure, temperature, time, etc.) in the dopant diffusion reactor.

Figure 7C:
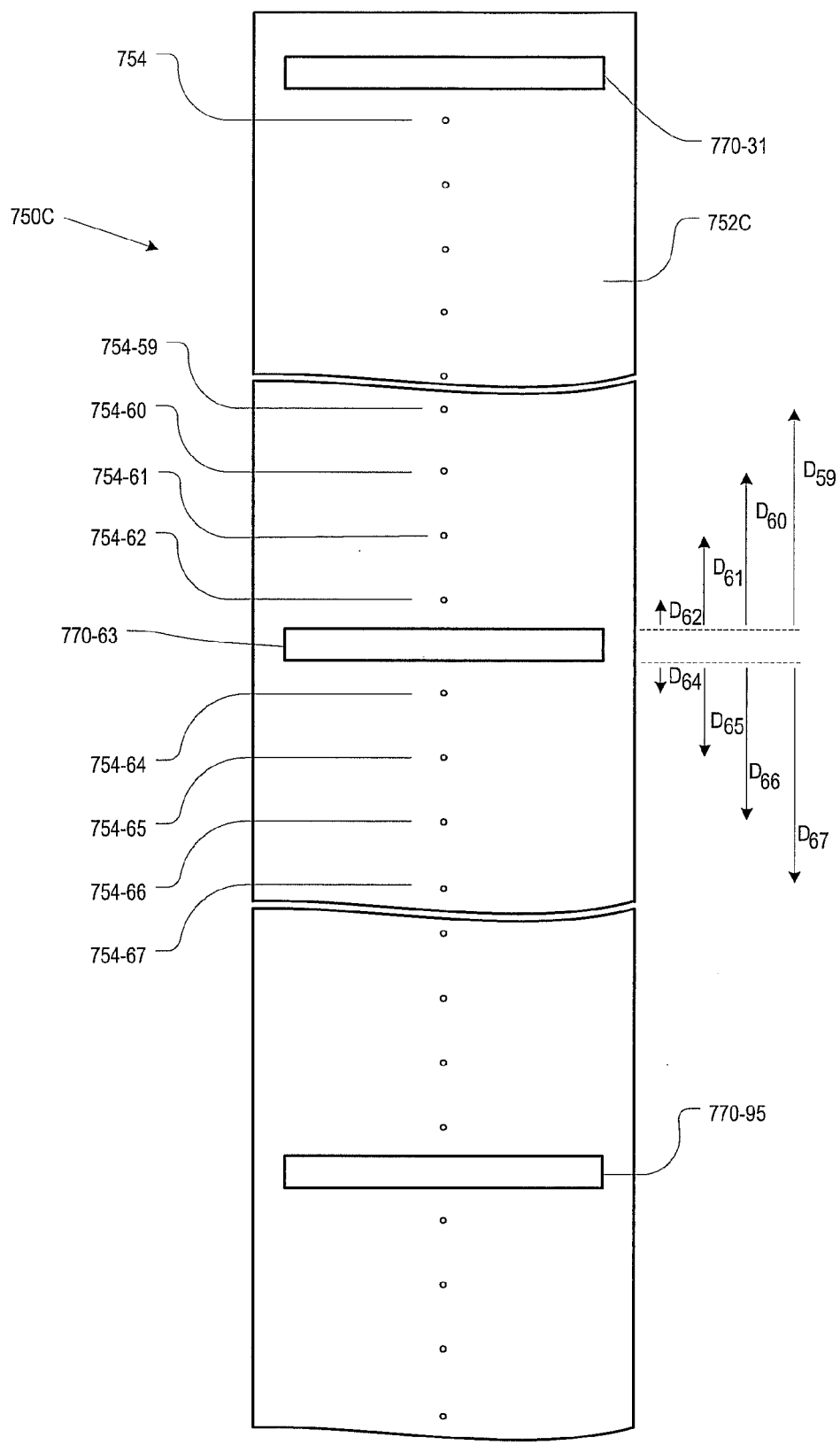
FIG. 7C depicts a portion of a wafer, including a diffusion mask, diffusion windows, and several dopant sinks.

FIG. 7C depicts a portion of wafer 750C. The wafer is covered by diffusion mask 752C, which includes a plurality of diffusion windows 754, each of which have a diameter of 40 microns. Diffusion mask 752C also includes a several dopant sinks 770-31, 770-63, and 770-95, which are spaced among the diffusion windows 754 In this embodiment, the dopant sinks are configured as rectangular openings in diffusion mask 752.

Figure 9:
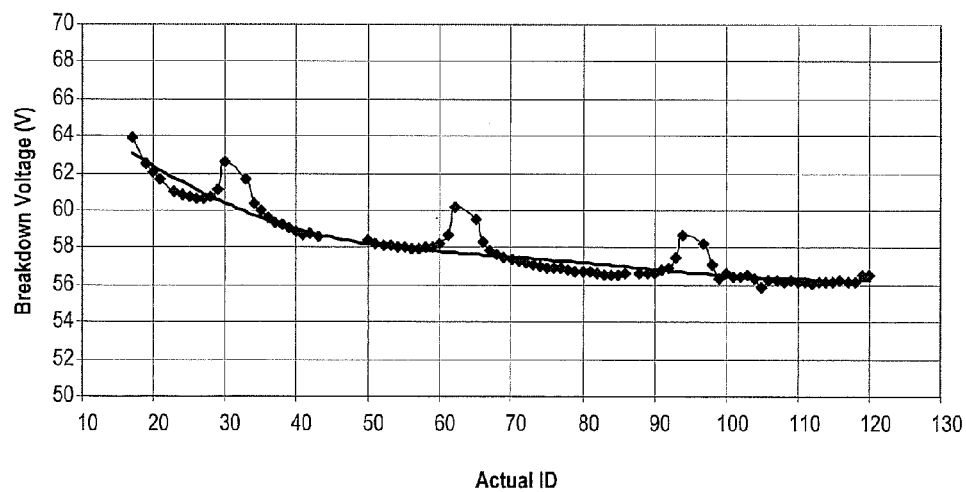
FIG. 9 depicts a plot of breakdown voltage for diffusion windows having a single size, but situated at different distances from dopant sinks, as per FIG. 7C. The plot illustrates a relationship between dopant diffusion depth and proximity to a dopant sink.

FIG. 9 depicts a plot of breakdown voltage for each device on wafer 750C of FIG. 7C. Since all diffusion windows 754 have the same size (i.e., 40 microns), the data depicted in FIG. 9 effectively illustrate the effect of the proximity between dopant sink and diffusion window on dopant diffusion depth.

For reference, a dopant sink (i.e., dopant sinks 770-31, 770-63, 770-95) is positioned between the two highest data points in each of the three "peaks" shown in FIG. 9. In other words, there is a dopant sink disposed near position 31, near position 63, and near position 95. For the purposes of this discussion, dopant sink 770-63 of FIG. 7C is assumed to be disposed at position 63.

With reference to FIG. 7C, the four diffusion windows that directly appear "beneath" dopant sink 770-63 are identified as 754-67, 754-66, 754-65, and 754-64, with window "754-67" being relatively further from dopant sink 770-63 and window "754-64" being relatively closer to the dopant sink. The four diffusion windows that appear directly "above" dopant sink 770-63 are identified as 754-62, 754-61, 754-60, and 754-59, with window "754-62" being relatively closer to dopant sink 770-63 and window "754-59" being relatively further from the dopant sink.

The measured breakdown voltages for devices that are located beneath the diffusion windows discussed above appear in Table 1 below. For clarity, only the unique two-digit number between 59 and 67 is used below to identify the position of the device/window. The distance between the diffusion window/device and dopant sink 770-63 is indicated in the table.

TABLE 1

Breakdown Voltage as a Function of Distance From Dopant Sink

| position | BreakDown Voltage (V) | Distance to dopant sink |
| --- | --- | --- |
| 59 | 58.1 | $D_{59} = 1400$ |
| 60 | 58.2 | $D_{60} = 1000$ |
| 61 | 58.7 | $D_{61} = 600$ |
| 62 | 60.2 | $D_{62} = 200$ |
| 64 | 59.7 | $D_{64} = 200$ |
| 65 | 58.2 | $D_{65} = 600$ |
| 66 | 57.9 | $D_{66} = 1000$ |
| 67 | 57.8 | $D_{67} = 1400$ |

The data in Table 1 above appears, with the data for other devices on the wafer, in FIG. 9. The data shows that, for the conditions prevailing in the diffusion reactor, the effect of the dopant sink on dopant diffusion depth falls off after about 1400 microns. Thus, for devices further away from a dopant sink than about 1400 micron, the size of the diffusion window controls dopant diffusion depth. For devices that are within about 1400 microns of a dopant sink, the sink affects dopant diffusion depth. This result is valid for masks in which the open area (unmasked region) of the dopant sink is relatively small compared to the area of the mask. The effect of the sink is to increase the breakdown voltage; in other words, the dopant sink results in a decrease in dopant diffusion depth.

The regular variation in breakdown voltage across the wafer (i.e., the steady decrease in breakdown voltage between position 18 and 120) is the effect of variation in the doping of the field control layer and the thickness of deposited layers across the wafer. For a hypothetical wafer in which such variations are not present, this regular variation would not be present.

Sub-operation 706. With regard to the relationship between the dopant diffusion depth and the size of the dopant sink, the larger the dopant sink, the shallower the dopant diffusion depth. Of course, that depends on the proximity of the sink to the diffusion window, as illustrated by FIG. 9. But as the open area of the diffusion mask (i.e., the size of the dopant sink) gets increasingly larger, its proximity to a diffusion window becomes of decreased importance. That is, a large amount of open mask area effectively nullifies the observed dependence of dopant diffusion depth on the size of the diffusion window or its proximity to the dopant sink.

Those skilled in the art will be able to design and implement experiments that will quantify the effect of the open area of a dopant sink on diffusion depth, for a given set of diffusion reactor conditions.

Sub-operation 708. In some embodiments, both the size of the diffusion window and the proximity of the window to a dopant sink are used to control dopant diffusion depth. This is examined with reference to FIGS. 7D and 10. This relationship is defined (quantified) by experimentation and applies to a specific set of conditions (e.g., dopant partial pressure, temperature, time, etc.).

Figure 10:
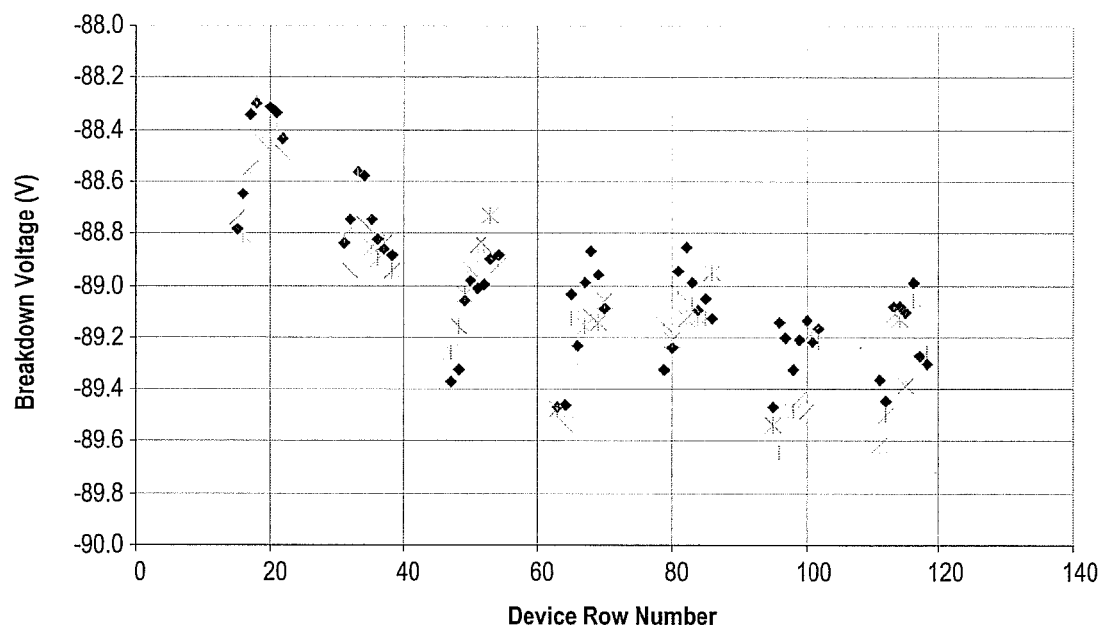
FIG. 10 depicts a plot of breakdown voltage for two different-size diffusion windows that are near to a dopant sink, as per FIG. 7D. The plot illustrates the competing effects of diffusion window size and proximity of a dopant sink on dopant diffusion depth.

FIG. 10 depicts the effect of a dopant sink on dopant diffusion depth when doping through diffusion windows 754 and 758 (see, e.g., FIG. 7B). FIG. 7D depicts the arrangement of the dopant sink to each diffusion window 754 and 758. Specifically, annular dopant sink 756 surrounds diffusion window 754 at a distance $D_{756}$ of 60 microns as measured between the outer edge of the diffusion window to inner edge of dopant sink. Annular dopant sink 760 surrounds diffusion window 758 at a distance $D_{760}$ of 60 microns as measured between the outer edge of the diffusion window to inner edge of dopant sink.

The data scatter in FIG. 10 shows that the presence of dopant sinks 756 and 760, at a distance of 60 microns from the diffusion windows, controls diffusion depth, such that the size of the diffusion window becomes a secondary effect. That is, dopant sinks 756 and 760 essentially equalized the dopant diffusion depth.

It will be appreciated that as the distance of the dopant sinks from the diffusion windows increases, the effect of the dopant sink on dopant diffusion depth will moderate. Thus, by adjusting this distance, through experimentation, the relative contributions of (1) the effect of window size on dopant diffusion depth and (2) the effect of the proximity of the dopant sink on dopant diffusion depth can be adjusted. This provides a fine measure of control over dopant diffusion depth.

Note that the breakdown voltages are greater for the devices when the dopant sinks were present (FIG. 10), than when they were absent (FIG. 8). This again demonstrates that, within its range of influence, the presence of a dopant sink will decrease dopant diffusion depth. This is consistent with the theory, stated earlier, that when a relatively greater fraction of the semiconductor surface is masked, a relatively greater amount of dopant is available for doping those portions of the surface that are unmasked (hence a greater dopant diffusion depth). And, conversely, if a relatively greater fraction of the semiconductor surface is not masked, a relatively lesser amount of dopant is available for doping those unmasked portions (hence a lesser dopant diffusion depth).

By performing the type of experiments described above, those skilled in the art will be able to define, for a specific set of reactor conditions and reactor type:
(a) the relationship between the size of a diffusion window and dopant diffusion depth;
(b) the relationship between dopant diffusion depth and the proximity of a dopant sink to a diffusion window;
(c) the relationship between the size of the dopant sink and dopant diffusion depth; and
(d) combinations of any of these factors.

Having obtained information about one or more of the aforementioned relationships, those skilled in the art will be able to form a diffusion mask having a first physical feature (e.g., a diffusion window or a dopant sink) that is characterized by a first attribute (size or proximity), wherein the attribute is a function of a desired dopant diffusion depth. Furthermore, those skilled in the art will be able to form a diffusion mask having a first physical feature (a diffusion mask) that is characterized by a first attribute and a second physical feature (a dopant sink) that is characterized by a second attribute wherein the first and second attributes are a function of a desired dopant diffusion depth.

Using the aforementioned physical features and attributes, a diffusion process can be operated so that:
(a) dopant are diffused into different devices (e.g., photodiodes, etc.) to different depths in one execution or run of a dopant diffusion process;
(b) dopant is diffused to the same depth in different devices, wherein variations in the size of the diffusion windows for the different devices would otherwise dictate that dopant is diffused to a different depth.

It is to be understood that the disclosure teaches just one example of the illustrative embodiment and that many variations of the invention can easily be devised by those skilled in the art after reading this disclosure and that the scope of the present invention is to be determined by the following claims.

What is claimed is:

1. A method for diffusing dopant into a semiconductor, wherein:
   (a) a first desired diffusion depth to which the dopant is to be diffused into the semiconductor at a first location to form a diffusion region for a first device is determined;
   (b) a diffusion mask is formed over the semiconductor;
   (c) a first diffusion window is formed in the mask, wherein the first diffusion window aligns with the first location and wherein the first diffusion window has a first size that is greater than the first desired diffusion depth; and
   (d) dopant is diffused into the semiconductor at the first location to the first desired diffusion depth during a first diffusion operation, wherein all dopant that is to be diffused into the diffusion region of the first device is delivered through the first diffusion window during the first diffusion operation;
   wherein the improvement comprises:
   controlling the first diffusion depth based on the size of the first diffusion window, wherein the first size is selected as a function of the first desired diffusion depth, and wherein the larger the first size of the first diffusion window, the shallower the dopant diffusion depth.

2. The method of claim 1 further comprising:
determining a second desired diffusion depth to which the dopant is to be diffused, at a second location, into the semiconductor to form a diffusion region for a second device;
forming a second diffusion window in the diffusion mask, wherein the second diffusion window aligns with the second location and is formed to have a second size that is a function of the second desired diffusion depth; and
diffusing, during the first diffusion operation, the dopant into the semiconductor at the second location to the second desired diffusion depth, wherein all dopant that is to be diffused into the diffusion region of the second device is delivered through the second diffusion window during the first diffusion operation.

3. The method of claim 1 further comprising forming a dopant sink in the diffusion mask wherein:
   (a) the dopant sink is an opening in the diffusion mask that is suitably remote from the first location such that dopant entering the first dopant sink and diffusing into the semiconductor will not form a part of the first device; and
   (b) the dopant sink is characterized by a first attribute that affects diffusion depth, wherein the first attribute is selected, in conjunction with the first size of the first diffusion window, to result in the dopant diffusing to the first desired diffusion depth.

4. The method of claim 3 wherein, in the operation of forming a dopant sink, the dopant sink is characterized by a second attribute that is selected, in conjunction with the first size of the first diffusion window and the first attribute, to result in the dopant diffusion to the first desired diffusion depth, wherein the first attribute is the distance between the dopant sink and the first diffusion window and the second attribute is the size of the dopant sink.

5. The method of claim 3 wherein, in the operation of forming a dopant sink, the first attribute is the distance between the dopant sink and the first diffusion window.

6. The method of claim 3 wherein, in the operation of forming a dopant sink, the first attribute is the size of the dopant sink.

7. The method of claim 3 wherein the dopant sink and the first diffusion window are concentric.

8. The method of claim 3 wherein the dopant sink has an annular shape and further wherein the dopant sink surrounds the first diffusion window.

9. A method for diffusing dopant into a semiconductor, wherein the method comprises:
    determining a first desired diffusion depth to which the dopant is to be diffused, at a first location, into the semiconductor to form a diffusion region for a first device;
    forming a diffusion mask over the semiconductor;
    forming a first diffusion window in the diffusion mask, wherein the first diffusion window aligns with the first location;
    forming a first dopant sink in the diffusion mask, wherein the first dopant sink is an opening in the diffusion mask at a location that is suitably remote from the first location such that dopant entering the first dopant sink and diffusing into the semiconductor will not form a part of the first device, and further wherein the dopant sink is characterized by a first attribute that is selected to achieve the first desired diffusion depth;
    diffusing, during a first diffusion operation, the dopant into the semiconductor at the first location to the first desired diffusion depth, wherein all dopant that is to be diffused into the diffusion region of the first device is delivered through the first diffusion window during the first diffusion operation.

10. The method of claim 9 wherein the first attribute is the size of the dopant sink.

11. The method of claim 9 wherein the first attribute is the proximity of the dopant sink to the first diffusion window.

12. The method of claim 9 further comprising forming a second diffusion region for a second device in the semiconductor, wherein a second desired diffusion depth of the second diffusion region is different than the first desired diffusion depth, wherein the second diffusion region is formed by:
    forming a second diffusion window in the diffusion mask that aligns with a second location at which the second diffusion region is to be formed, wherein the second diffusion window is formed to be the same size as the first diffusion window;
and wherein the difference between the first desired diffusion depth and the second desired diffusion depth results from:
    selecting the location for the first dopant sink so that the distance between the first diffusion window and the first dopant sink is different than the distance between the second diffusion window and the first dopant sink.

13. A method for diffusing dopant into a semiconductor, wherein:
    (a) a first desired diffusion depth to which the dopant is to be diffused into the semiconductor at a first location to form a diffusion region for a first device is determined;
    (b) a diffusion mask is formed over the semiconductor;
    (c) a first diffusion window is formed in the mask, wherein the first diffusion window aligns with the first location and has a first size that is greater than the first desired diffusion depth;
    (d) a second diffusion window is formed in the mask, wherein the second diffusion window aligns with a second location at which dopant is to be diffused to form a diffusion region for a second device, and wherein the second diffusion window has a second size that is greater than the first desired diffusion depth; and
    (e) dopant is diffused into the semiconductor at the first location and the second location, wherein all dopant that is to be diffused into the diffusion region of the first device is delivered through the first diffusion window during the first diffusion operation and all dopant that is to be diffused into the diffusion region of the second device is delivered through the second diffusion window during the first diffusion operation;
    wherein the improvement comprises:
        determining a second desired diffusion depth to which the dopant is to be diffused into the semiconductor at the second location; and
        forming the first diffusion window and the second diffusion window such that the diffusion windows have different sizes, wherein the first size is a function of the first desired diffusion depth and the second size is a function of the second desired diffusion depth.

14. A method for diffusing dopant into a semiconductor comprising:
    (a) forming a diffusion mask over the semiconductor;
    (b) forming, in the diffusion mask, a first diffusion window having a first size, wherein the first diffusion window aligns with a first location in the semiconductor at which a first diffusion region for a first device is to be formed;
    (c) forming, in the diffusion mask, a second diffusion window having a second size that is different from the first size, wherein the second diffusion window aligns with a second location in the semiconductor at which a second diffusion region for a second device is to be formed;
    (d) forming, in the diffusion mask, a first dopant sink, wherein the dopant sink is an opening in the diffusion mask at a location that is suitably remote from the first location and the second location such that dopant entering the first dopant sink and diffusing into the semiconductor will not form a part of the first device or the second device, and further wherein the dopant sink is formed to have a first attribute causes dopant to diffuse to the same depth at the first location and at the second location; and
    (e) diffusing, during a single diffusion operation, the dopant into the semiconductor at the first location and the second location to the same depth.

15. The method of claim 14 wherein the first attribute is the open area of the first dopant sink.

16. The method of claim 14 wherein the first attribute is the distance between the dopant sink and the first and second diffusion windows.

17. A method for forming a p-n junction by diffusing dopant into a semiconductor, the method comprising:
    determining one or more desired diffusion depths to which dopant is to be diffused at one or more locations into semiconductor;

forming a mask over the semiconductor;
forming one or more diffusion windows in the mask, wherein the diffusion windows align with the locations in the semiconductor;
forming one or more dopant sinks in the mask, wherein a first attribute of the dopant sinks is selected to achieve the desired diffusion depths; and
diffusing dopant into the semiconductor through the diffusion windows to the desired diffusion depths.

18. The method of claim 17 wherein, in the operation of forming diffusion windows, at least some of the windows have a size that is a function of the desired diffusion depths.

* * * * *